(12) United States Patent
Sato et al.

(10) Patent No.: US 8,120,092 B2
(45) Date of Patent: Feb. 21, 2012

(54) SEMICONDUCTOR MEMORY DEVICE AND MANUFACTURING METHOD THEREFOR

(75) Inventors: Atsuhiro Sato, Tokyo (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 12/565,181

(22) Filed: Sep. 23, 2009

(65) Prior Publication Data

US 2010/0176435 A1 Jul. 15, 2010

(30) Foreign Application Priority Data

Jan. 9, 2009 (JP) ................... 2009-003857

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ......... 257/319; 257/408; 257/392; 257/393

(58) Field of Classification Search ................... 257/151, 257/152, 153, 249, 331, 387, 390, 202, 365, 257/336, 292, 401, 187, 369, 408, 409, 499, 257/314–325, 392–393
See application file for complete search history.

(56) References Cited

U.S. PATENT DOCUMENTS

2006/0038218 A1* 2/2006 Yaegashi et al. .............. 257/314
2008/0121965 A1* 5/2008 Sato et al. ..................... 257/314

FOREIGN PATENT DOCUMENTS

| JP | 2002-231832 | 8/2002 |
| JP | 2005-197308 | 7/2005 |
| KR | 10-2005-0035097 | 4/2005 |
| KR | 10-2008-0041041 | 5/2008 |

OTHER PUBLICATIONS

Office Action issued Apr. 12, 2011 in Korea Application No. 10-2010-0001713 (With English Translation).

* cited by examiner

*Primary Examiner* — Chuong A. Luu
(74) *Attorney, Agent, or Firm* — Oblon, Spivak, McClelland, Maier & Neustadt, L.L.P.

(57) ABSTRACT

First gate electrodes of memory cell transistors are formed in series with each other on a semiconductor substrate. A second gate electrode of a first selection transistor is formed adjacent to one end of the first electrodes. A third gate electrode of a second selection transistor is formed adjacent to the second electrode. A fourth gate electrode of a peripheral transistor is formed on the substrate. First, second, and third sidewall films are formed on side surfaces of the second, third, and fourth gate electrodes, respectively. A film thickness of the third sidewall film is larger than that of the first and second sidewall films. A space between the first electrode and the second electrode is larger than a space between the first electrodes, and a space between the second electrode and the third electrode is larger than a space between the first electrode and the second electrode.

7 Claims, 8 Drawing Sheets

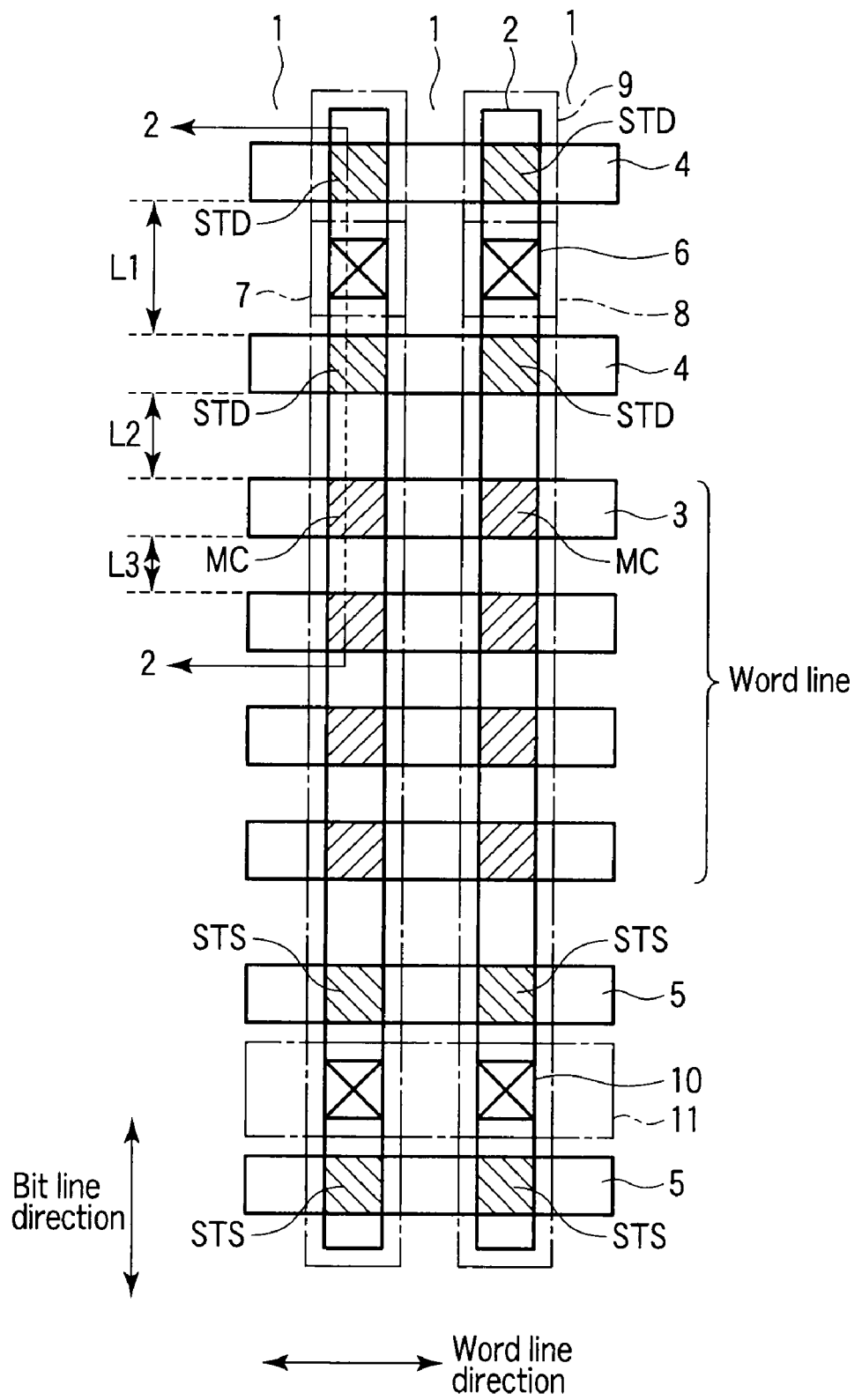
F I G. 1

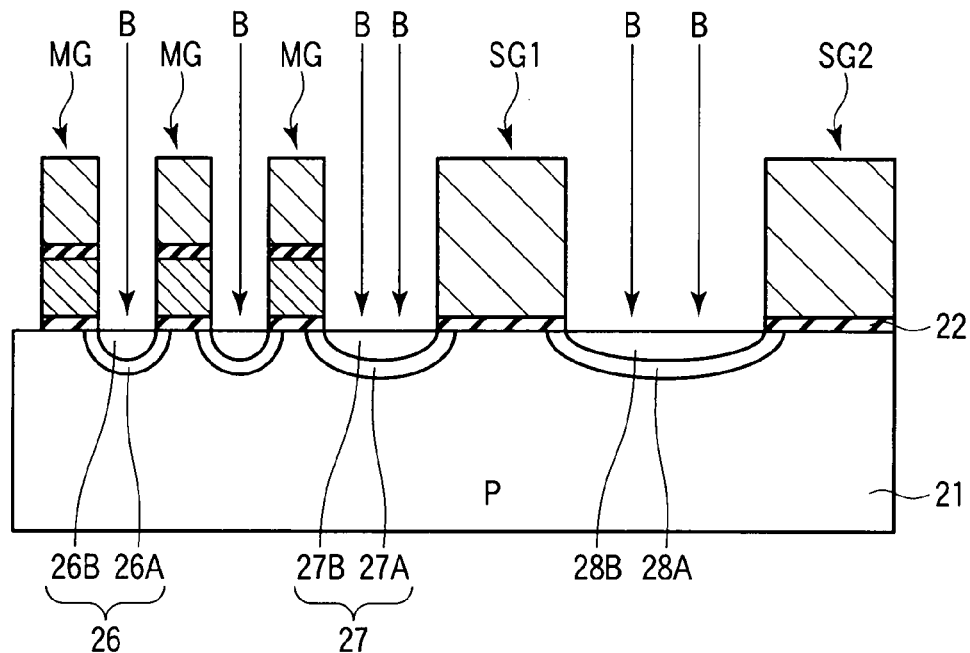
F I G. 4
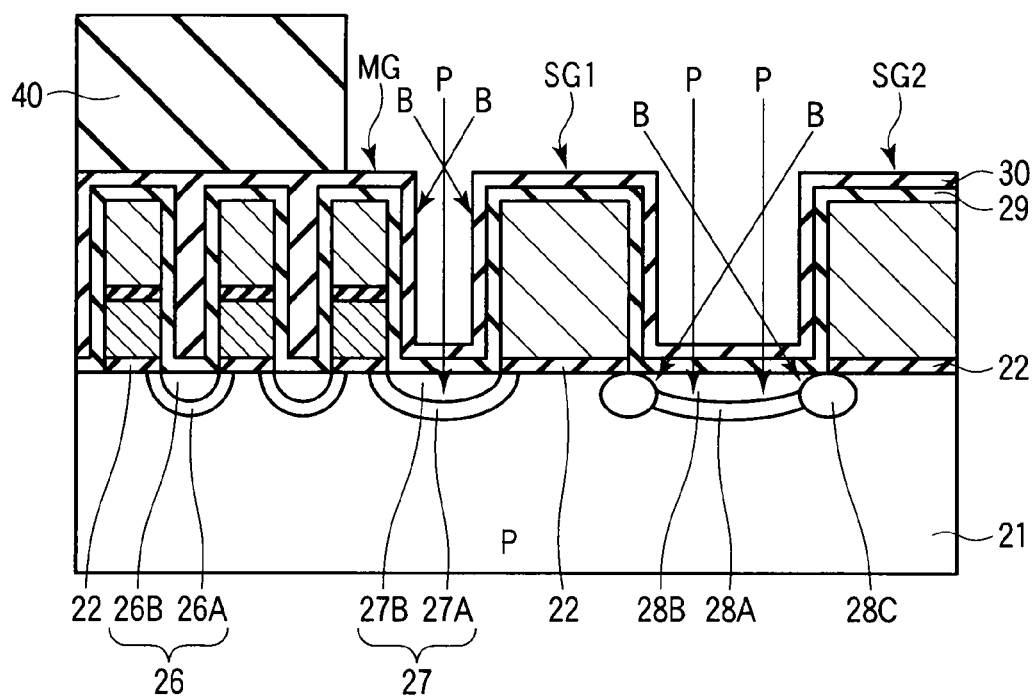
F I G. 5

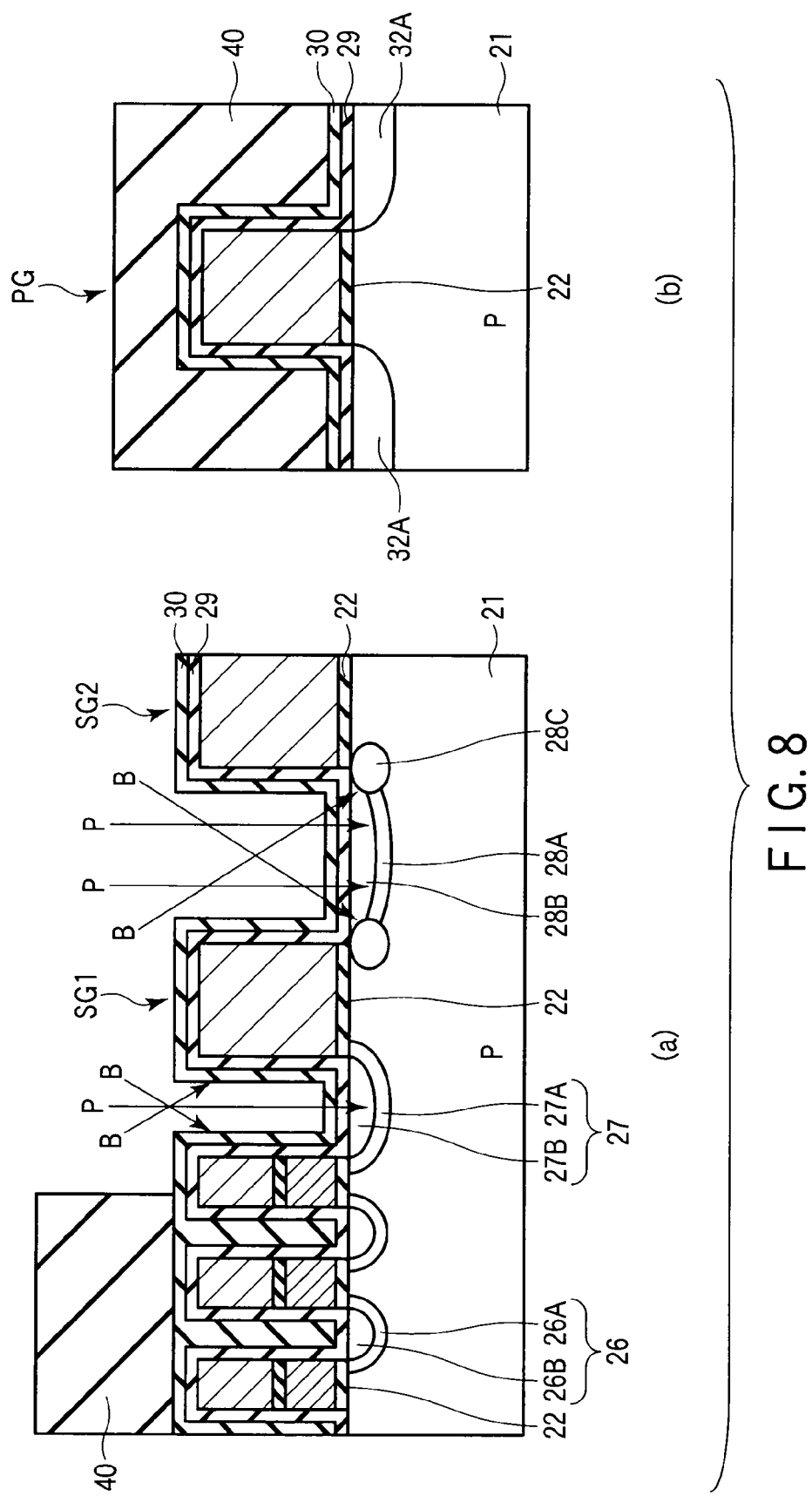
F I G. 8

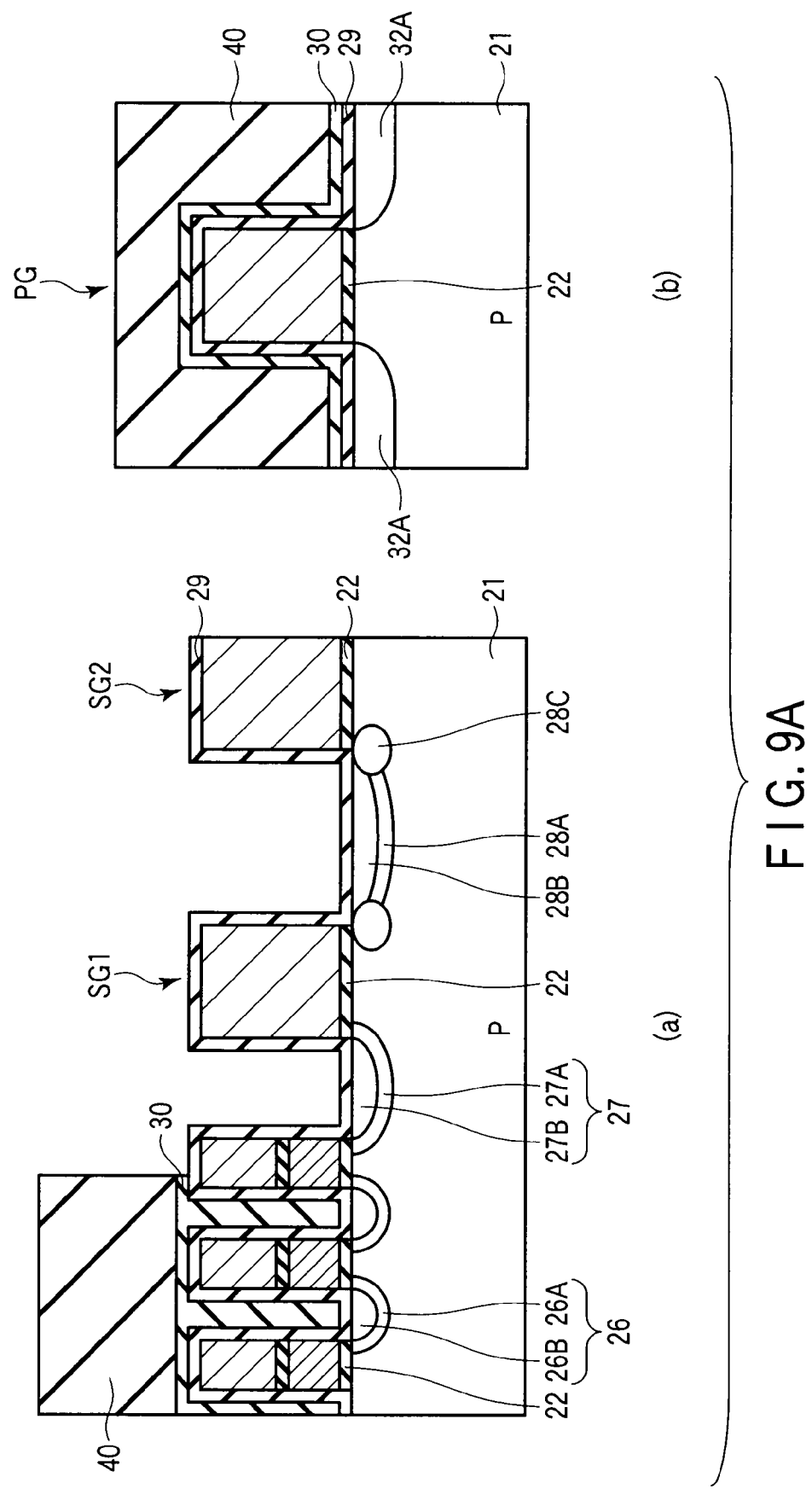
F I G. 9A

SEMICONDUCTOR MEMORY DEVICE AND MANUFACTURING METHOD THEREFOR

CROSS-REFERENCE TO RELATED APPLICATIONS

This application is based upon and claims the benefit of priority from prior Japanese Patent Application No. 2009-003857, filed Jan. 9, 2009, the entire contents of which are incorporated herein by reference.

BACKGROUND OF THE INVENTION

1. Field of the Invention

The present invention relates to a semiconductor memory device and a manufacturing method therefor, for example, a NAND flash memory including a selection gate transistor.

2. Description of the Related Art

A NAND flash memory has a NAND string in which a drain-side selection gate transistor and a source-side selection gate transistor are arranged at both ends of memory transistors connected in series with each other. The drain-side selection gate transistor is connected to a bit line through a bit line contact electrode. The source-side selection gate transistor is connected to a source line through a source line contact electrode. The NAND strings are arranged in a direction orthogonal to a direction in which memory cells are connected in series with each other. Adjacent NAND strings are arranged such that drain-side selection transistors of the NAND strings are adjacent to each other or source-side selection transistors of the NAND strings are adjacent to each other.

A method of manufacturing a conventional NAND flash memory is described in Jpn. Pat. Appln. KOKAI Publication No. 2002-231832.

In this manufacturing method, if a space between a memory cell transistor and a selection gate transistor adjacent thereto (space between MG and SG1) and a space between adjacent selection gate transistors (space between SG1 and SG2) are larger than a space between the adjacent memory transistors (space between MG and MG) each, halo ion implantation is consequently performed at a high concentration between MG and SG1 and between SG1 and SG2. As a result, a threshold voltage of the memory cell transistor arranged adjacent to the selection gate transistor disadvantageously excessively rises.

Aside from this, on a semiconductor substrate on which the memory cell transistors and the selection gate transistors are formed, a peripheral circuit including a peripheral transistor is formed.

A semiconductor memory device in which a film thickness of a sidewall insulating film of the peripheral transistor is larger than a film thickness of a sidewall insulating film of the memory cell transistor is disclosed in Jpn. Pat. Appln. KOKAI Publication No. 2005-197308.

However, when the sidewall insulating film formed between the adjacent selection gate transistors (between SG1 and SG2) increases, a contact electrode connected to a bit line is disadvantageously brought into contact with the sidewall insulating film. In order to avoid this, the space between SG1 and SG2 must be increased. In this case, the length of the NAND cell increases, and, consequently, a chip area disadvantageously increases.

BRIEF SUMMARY OF THE INVENTION

According to a first aspect of the present invention, there is provided a semiconductor memory device comprising: first gate electrodes of a plurality of memory cell transistors formed on a semiconductor substrate in series with each other; a second gate electrode of a first selection gate transistor which is adjacent to one end of the plurality of first gate electrodes formed in series with each other and formed on the semiconductor substrate; a third gate electrode of a second selection gate transistor which is adjacent to the second gate electrode of the first selection gate transistor and formed on the semiconductor substrate; a fourth gate electrode of a peripheral transistor formed on the semiconductor substrate; a first sidewall insulating film formed on a side surface of the second gate electrode; a second sidewall insulating film formed on a side surface of the third gate electrode; and a third sidewall insulating film formed on a side surface of the fourth gate electrode. A film thickness of the third sidewall insulating film is larger than film thicknesses of the first sidewall insulating film and the second sidewall insulating film. A space between the first gate electrode and the second gate electrode is larger than a space between the first gate electrodes, and a space between the second gate electrode and the third gate electrode is larger than the space between the first gate electrode and the second gate electrode.

According to a second aspect of the present invention, there is provided a method of manufacturing a semiconductor memory device comprising: forming a plurality of first gate electrodes of a plurality of memory cell transistors, a second gate electrode of a first selection gate transistor, and a third gate electrode of a second selection gate transistor on a semiconductor substrate, the plurality of first gate electrodes being arranged at predetermined spaces in series with each other, the second gate electrode being arranged at one end of the plurality of first gate electrodes arranged in series with each other, and the third gate electrode being arranged adjacent to the second gate electrode; covering the plurality of first gate electrodes, the second gate electrode, and the third gate electrode with a first insulating film, and forming the first insulating film on the semiconductor substrate; forming a second insulating film on the first insulating film; forming a mask material on the second insulating film to cover a gap between the first gate electrodes and to form a opening between the first gate electrode and the second gate electrode and between the second gate electrode and the third gate electrode; after the mask material is formed, removing the second insulating films between the first gate electrode and the second gate electrode and between the second gate electrode and the third gate electrode; after the mask material is removed, covering the plurality of first gate electrodes, the second gate electrode, and the third gate electrode with a third insulating film, and forming the third insulating film on the semiconductor substrate; and etching the third insulating film by anisotropic etching to form sidewall insulating films on a side surface of the first gate electrode between the first gate electrode and the second gate electrode and on side surfaces of the second and third gate electrodes.

According to a third aspect of the present invention, there is provided a method of manufacturing a semiconductor memory device comprising: forming a plurality of first gate electrodes of a plurality of memory cell transistors, a second gate electrode of a first selection gate transistor, a third gate electrode of a second selection gate transistor, and a fourth gate electrode of a peripheral transistor on a semiconductor substrate, the plurality of first gate electrodes being arranged at predetermined spaces in series with each other, the second gate electrode being arranged at one end of the plurality of first gate electrodes arranged in series with each other, and the third gate electrode being arranged adjacent to the second gate electrode; covering the plurality of first gate electrodes, the second gate electrode, the third gate electrode, and the fourth gate electrode with a first insulating film, and forming the first insulating film on the semiconductor substrate; forming a second insulating film on the first insulating film; forming a mask material on the second insulating film to cover a gap between the first gate electrodes and the fourth gate electrode and to form a opening between the first gate electrode and the second gate electrode and between the second gate electrode and the third gate electrode; after the mask material is formed, removing the second insulating films between the first gate electrode and the second gate electrode and between the second gate electrode and third gate electrode; after the mask material is removed, covering the plurality of first gate electrodes, the second gate electrode, the third gate electrode, and the fourth gate electrode with a third insulating film, and forming the third insulating film on the semiconductor substrate; and etching the third insulating film by anisotropic etching to form first sidewall insulating films on a side surface of the first gate electrode between the first gate electrode and the second gate electrode and on side surfaces of the second and third gate electrodes and to form a second sidewall insulating film on a side surface of the fourth gate electrode.

BRIEF DESCRIPTION OF THE SEVERAL VIEWS OF THE DRAWING

FIG. 1 is a layout diagram showing a configuration of a NAND flash memory according to a first embodiment of the present invention.

FIGS. 3, 4, 5, 6A and 6B are sectional views showing a method of manufacturing the NAND flash memory according to the first embodiment.

FIGS. 8, 9A and 9B are sectional views showing a method of manufacturing the NAND flash memory according to the second embodiment.

DETAILED DESCRIPTION OF THE INVENTION

Figure 2:
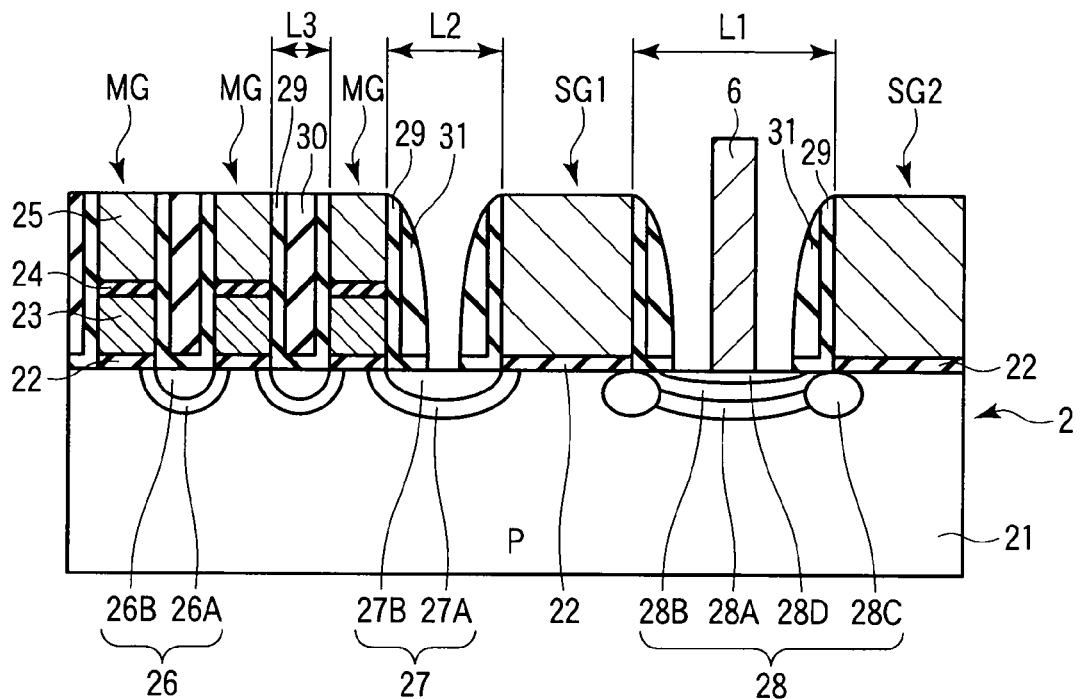
FIG. 2 is a sectional view along line 2-2 in FIG. 1.

A semiconductor memory device according to an embodiment of the present invention will be described below with reference to the accompanying drawings. In this case, as the semiconductor memory device, a NAND flash memory will be exemplified. In the explanation, common reference numbers denote common parts throughout the drawings.

First Embodiment

A NAND flash memory according to a first embodiment of the present invention will be described below.

FIG. 1 is a layout diagram showing a configuration of the NAND flash memory according to the first embodiment.

As shown in FIG. 1, NAND cell units are formed on element regions 2 divided by a plurality of element isolation regions 1 extending in a bit line direction. Four memory cell transistors MC are connected in series with each other, a drain-side selection gate transistor STD and a source-side selection gate transistor STS are connected in series with the four serially connected memory cell transistors MC such that source and drain diffusion layers are shared.

The memory cells MC aligned in a word line direction which is a horizontal direction in FIG. 1 are connected to each other by a common control gate line (word line) 3. The drain-side selection gate transistors STD are connected to each other by common drain-side selection gate lines 4, and the source-side selection gate transistors STS are connected to each other by common source-side selection gate lines 5.

In this case, the lines are arranged to satisfy "a length (L1) between the drain-side selection gate line 4 and the drain-side selection gate line 4">"a length (L2) between the drain-side selection gate line 4 and the word line 3">"a length (L3) between the word line 3 and the word line 3". Similarly, the lines are arranged to satisfy "a length (L1) between the source-side selection gate line 5 and the source-side selection gate line 5">"a length (L2) between the source-side selection gate line 5 and the word line 3">"a length (L3) between the word line 3 and the word line 3".

To the drain-side selection gate transistor STD, a bit line connection unit 7 configured by a first interconnect layer is connected through a bit line contact electrode 6, and a bit line 9 is connected through an interconnection contact electrode 8. To the source-side selection gate transistor STS, a source line 11 constituted by a first interconnect layer is connected through a source line contact electrode 10.

Four memory cell transistors MC, the drain-side selection gate transistor STD, and the source-side selection gate transistor STS constitute one NAND string. One NAND string is adjacent to another NAND string through the bit line contact electrode 6 in a bit line direction. Furthermore, the NAND string is adjacent to another NAND string through the source line contact electrode 10 in a bit line direction. The number of memory cell transistors MC is not limited to 4. The number may be 8, 16, 32, 64, or 128.

FIG. 2 is a sectional view along line 2-2 in FIG. 1, and shows a sectional structure of the NAND flash memory according to the first embodiment. FIG. 2 shows three memory cell transistors and one selection gate transistor in a NAND cell and a selection gate transistor of another NAND cell arranged adjacent to the NAND cell. Furthermore, an interlayer insulating film, a interconnect layer, and the like formed on the memory cell transistors and the selection gate transistor are not shown.

As shown in FIG. 2, on a semiconductor substrate (for example, p-type silicon substrate) 21, the element regions 2 divided by element isolation regions (not shown) are formed. A gate insulating film 22 is formed on the semiconductor substrate 21 of the element region, and a gate electrode MG of a memory cell transistor is formed on the gate insulating film 22.

Each of the gate electrodes MG is constituted by a laminate gate and has a floating gate electrode 23, an inter-gate insulating film 24, and a control gate electrode 25. The floating gate electrode 23 is a charge accumulation layer in which charges are accumulated. On the floating gate electrode 23, the inter-gate insulating film 24 is formed. The control gate electrode 25 is formed on the inter-gate insulating film 24. The control gate electrode 25 is shared by adjacent memory cells MCs in a word line direction to serve as a word line.

Each of the memory cells MC are connected in series with each other to share source and drain diffusion layers 26 formed in the semiconductor substrate 21.

The drain-side selection gate transistor is arranged at one end of the memory cells connected in series with each other. The drain-side selection gate transistor has the gate insulating film 22 and a selection gate electrode (selection gate line) SG1, a diffusion layer 27, and a bit line contact diffusion layer 28 which are formed through the gate insulating film 22. The diffusion layer 27 and the bit line contact diffusion layer 28 are formed in the semiconductor substrate 21, and the diffusion layer 27 is arranged on the gate electrode MG side through selection gate electrode SG1, and the bit line contact diffusion layer 28 is arranged on an opposite side of the gate electrode MG.

Furthermore, a drain-side selection gate transistor in another NAND string is arranged adjacent to the drain-side selection gate transistor to share the bit line contact diffusion layer 28. The drain-side selection gate transistor similarly has the gate insulating film 22, a selection gate electrode (selection gate line) SG2, a diffusion layer (not shown), and the bit line contact diffusion layer 28.

The bit line contact electrode 6 is formed between the drain-side selection gate transistors. A bottom surface of the bit line contact electrode 6 is on the bit line contact diffusion layer 28. The bit line contact electrode 6 is electrically connected to the bit line contact diffusion layer 28.

In this case, the source and drain diffusion layers 26 is constituted by a first diffusion layer 26A and a second diffusion layer 26B. The source and drain diffusion layers 26 is formed at the deepest position of the source and drain diffusion layers 26 by using boron (B) ions as impurity ions. The first diffusion layer 26A adjusts a threshold value of a memory cell transistor and acts as a punch-through stopper. The second diffusion layer 26B functions as a source and a drain of a memory cell transistor by using, for example, arsenic (As) ions as impurity ions. In this case, the diffusion layer 26 serves as an n-type diffusion layer on the basis of a relationship between impurity concentrations and diffusion positions of the first diffusion layer 26A and the second diffusion layer 26B.

The diffusion layer 27 is constituted by a first diffusion layer 27A and a second diffusion layer 27B. The first diffusion layer 27A is formed at the deepest position of the diffusion layer 27 by using, for example, boron and phosphorous ions as impurity ions. The first diffusion layer 27A adjusts a threshold value of a selection gate transistor and acts as a punch-through stopper. The second diffusion layer 27B functions as a source and a drain of the selection gate transistor by using, for example, arsenic ions as impurity ions. In this case, the diffusion layer 27 serves as an n-type diffusion layer on the basis of a relationship between the impurity concentrations and the diffusion positions of the first diffusion layer 27A and the second diffusion layer 27B.

The bit line contact diffusion layer 28 is constituted by a first diffusion layer 28A, a second diffusion layer 28B, a third diffusion layer 28C, and a fourth diffusion layer 28D. The first diffusion layer 28A is formed at the deepest position of the bit line contact diffusion layer 28 by using, for example, B and P ions as impurity ions. The first diffusion layer 28A adjusts a threshold value of a selection gate transistor and acts as a punch-through stopper. The second diffusion layer 28B functions as a source and a drain of the selection gate transistor by using As or P ions as impurity ions. The third diffusion layer 28C is formed under the selection gate electrodes SG1 and SG2 to overlap the selection gate electrodes SG1 and SG2, and acts to control the threshold value of the selection gate transistor. The fourth diffusion layer 28D uses, for example, arsenic ions as impurity ions, is present in a surface region of the diffusion layer 28, and has an impurity concentration higher than that of the second diffusion layer 28B. The fourth diffusion layer 28D functions to decrease a contact resistance to the bit line contact electrode 6. In this case, the bit line contact diffusion layer 28 serves as an n-type diffusion layer on the basis of a relationship between impurity concentrations and diffusion positions of the first to fourth diffusion layers 28A, 28B, 28C, and 28D.

In this case, the impurity concentrations in the diffusion layer 27 and the diffusion layer 26 are almost equal to each other. When a space between the gate electrode MG and selection gate electrode SG1 and a space between the selection gate electrodes SG1 and SG2 are larger than the space between the gate electrodes MG, equal doses of impurities are implanted by ion implantation to form the diffusion layers 26A and 27A. In this case, although area densities of impurities in implantation are not changed, the total dose of B in the diffusion layer 27A is larger than that in the diffusion layer 26A. By scattering by causing ions to run into the gate electrodes, the impurity concentration of B in the diffusion layer 27A is higher than that in the diffusion layer 26A. As a result, a large number of boron (B) ions are diffused under the gate electrode MG to increase the threshold value of the memory cell transistor MC adjacent to the selection gate electrodes SG1 and SG2.

As counter implantation in the first diffusion layer 27A, for example, phosphorous (P) ions are implanted by ion implantation. The boron (B) ions in the first diffusion layer 27A are neutralized by the phosphorous ions, so that the threshold value of the memory cell transistor MC adjacent to the selection gate electrodes SG1 and SG2 are prevented from rising. As a result, a total concentration of p-type and n-type impurities in the diffusion layer 26 is almost equal to that in the diffusion layer 27.

Phosphorous ions are used here because phosphorous ions can be implanted into a deep position of the semiconductor substrate 21 since the atomic weight of phosphorous is higher than that of arsenic and can effectively neutralize boron ions. More specifically, the diffusion layer 27B contains phosphorous which is not contained in the diffusion layer 26B. Furthermore, the n-type impurity concentration in the diffusion layer 27 is larger than that in the diffusion layer 26.

On side surfaces of the gate electrodes between the plurality of gate electrodes MG and side surfaces of the selection gate electrodes SG1 and SG2, a first insulating film, for example, a high-temperature oxide (HTO) film 29 is formed. At this time, the HTO film 29 is formed to have such a film thickness that the HTO film 29 completely buries gaps between the gate electrodes MG of the memory cell transistors.

On the HTO film 29 between the plurality of gate electrodes MG, a second insulating film, for example, a tetraethoxysilane (TEOS) film 30 is formed. At this time, the TEOS film 30 is formed to completely bury gaps between the plurality of gate electrodes MG.

On the HTO films 29 on the side surfaces of the selection gate electrodes SG1 and SG2, a third insulating film, for example, a tetraethoxysilane (TEOS) film 31 is formed. In this manner, on the side surfaces of the selection gate electrodes SG1 and SG2, a sidewall insulating film constituted by a laminated film including the HTO film 29 and the TEOS film 31 is formed. As the materials of the second insulating film 30 and the third insulating film 31, the same material may be used, or different materials may be used. The second insulating film 30 and the third insulating film 31 may have the same or different film qualities.

On the side surface of the gate electrode MG between the gate electrode MG and selection gate electrode SG1, similarly, a sidewall insulating film constituted by a laminated film including the HTO film 29 and the TEOS film 31 is formed.

According to the first embodiment having the above structure, in order to prevent punch-through caused by excessively implanting an impurity into a diffusion layer between a memory cell and a selection gate transistor, compensation is performed by a punch-through stopper. For this reason, a threshold voltage of a memory cell adjacent to the selection gate transistor can be prevented from rising.

A method of manufacturing a NAND flash memory according to the first embodiment will be described below.

Figure 3:
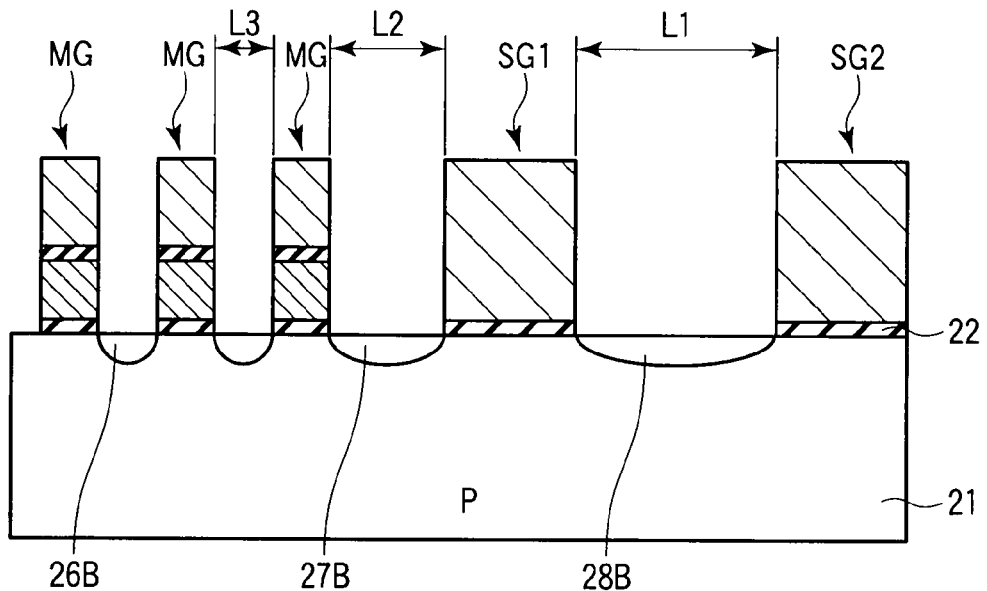

FIGS. 3 to 6B are sectional views showing a method of manufacturing a NAND flash memory according to the first embodiment. As shown in FIG. 3, on the semiconductor substrate 21, since the steps performed until gate electrodes MG of a plurality of memory cell transistors arranged in series with each other and selection gate electrodes SG1 and SG2 of selection gate transistors are formed on the semiconductor substrate 21 are the same as those in a conventional manufacturing method, an explanation of the steps will be omitted.

In this case, due to the restrictions of a so-called sidewall forming process and lithography, as shown in FIG. 3, gate electrodes are formed to satisfy a space (L1) between SG1 and SG2>a space (L2) between MG and SG1>a space (L3) between MG and MG. Furthermore, for example, arsenic ions are implanted into the semiconductor substrates 21 between MG and MG, between MG and SG1, and SG1 and SG2 by ion implantation using gate electrodes as masks to form n-type diffusion layers 26B, 27B, and 28B. In the ion implantation performed here, arsenic ions are implanted into a semiconductor substrate surface in a vertical direction.

As shown in FIG. 4, p-type impurity ions, for example, boron ions are implanted into the semiconductor substrate 21 under the diffusion layers 26B, 27B, and 28B by ion implantation to form the diffusion layers 26A, 27A and 28A which adjust a threshold value and serve as punch-through stoppers (halo ion implantation). In the ion implantation performed here, boron ions are implanted into the semiconductor substrate surface in a vertical direction. In this case, although an area density of impurity in implantation does not change, a total dose of boron in the first diffusion layer 27A is larger than a total dose of boron in the first diffusion layer 26A. Since a space between SG1 and SG2 and a space between MG and SG1 are larger than the space between MG and MG, even though ions are vertically implanted into the semiconductor substrate surface, the ions do not travel exactly vertical to the semiconductor substrate surface. For this reason, some ions are brought into contact with the gate electrode to cause scattering. As a result, boron concentrations in the diffusion layers 27A and 28A between SG1 and SG2 and between MG and SG1 may be higher than a boron concentration in the first diffusion layer 26A between MG and MG.

As shown in FIG. 5, a first insulating film, for example, the HTO film 29 is formed by, for example, CVD to cover the gate electrodes MG and the selection gate electrodes SG1 and SG2 and an upper side of the semiconductor substrate 21, i.e., the diffusion layers 26B, 27B and 28B. At this time, the HTO film 29 is formed to have such a film thickness that the HTO film 29 does not completely bury gaps between the gate electrodes MG of the memory cell transistors. In formation of the HTO film 29, a high-temperature long-time process which has hydrogen content is small and a small number of trapped electric charges is used. A silicon oxide film formed by the above process is called an HTO film in the field of semiconductors.

Subsequently, a second insulating film, for example, the TEOS film 30 is formed on the HTO film 29 by CVD. At this time, the TEOS film 30 is formed to have such a film thickness that the TEOS film 30 completely buries gaps between the plurality of gate electrodes MG and does not completely bury a gap between the gate electrode MG and selection gate electrode SG1 and a gap between the selection gate electrodes SG1 and SG2. As described above, this condition is made possible such that space (L1) between SG1 and SG2>space (L2) between MG and SG1>space (L3) between MG and MG. In formation of the TEOS film 30, as a source gas, $Si(OC_2H_5)_4$, i.e., tetraethoxysilane (TEOS) is used. The silicon oxide film formed by using TEOS as a source gas is called a TEOS film in the field of semiconductors.

A resist 40 is applied to the resultant structure to form openings between MG and SG1 and between SG1 and SG2. In order to decrease boron concentrations in the diffusion layers 27A and 28A between MG and SG1 and between SG1 and SG2, for example, phosphorous (P) ions are implanted into the diffusion layers 27A and 28A as counter implantation by ion implantation. In this case, doses of phosphorous to be implanted are adjusted such that a threshold value of the memory cell transistor MC adjacent to the selection gate electrodes SG1 and SG2 is equal to a threshold value of the memory cell transistor MC. As a result, a total concentration of n-type and p-type impurities in the diffusion layer 26A is almost equal to that in the diffusion layer 27A.

Furthermore, boron ions are implanted into only the semiconductor substrate 21 under the gate electrodes SG1 and SG2 between SG1 and SG2 by oblique ion implantation to form the diffusion layer 28C. More specifically, the diffusion layer 28C is formed such that a p-type impurity, for example, boron ions are implanted into the semiconductor substrate surface by ion implantation in a direction inclined by a predetermined angle with respect to a direction vertical to the semiconductor substrate surface. In this case, since space (L1) between SG1 and SG2>space (L2) between MG and SG1 is satisfied, boron ions are implanted into the semiconductor substrate 21 between SG1 and SG2. However, boron ions are implanted into the semiconductor substrate 21 between MG and SG1 because the boron ions are blocked by the side surfaces of the gate electrode MG and selection gate electrode SG1. In other words, the oblique ion implantation of boron ions is performed at such a predetermined angle that the boron ions are implanted into only portions under the gate electrodes SG1 and SG2 between SG1 and SG2 and are not implanted into portions under the gate electrodes MG and SG1 between MG and SG1.

In this manner, when the source diffusion layer and the drain diffusion layer of selection gate electrode SG1 are made asymmetrical, defective writing (erroneous writing) caused by GIDL (Gate Induced Drain Leakage) in data writing can be reduced while improving cut-off characteristics.

Figure 6A:
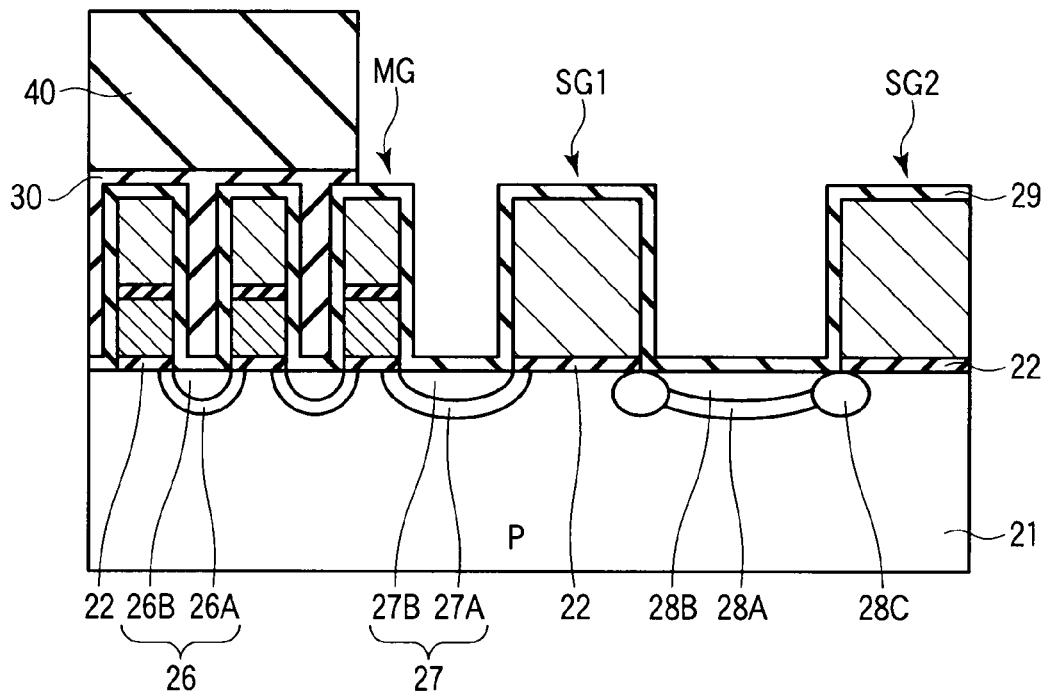

As shown in FIG. 6a, the TEOS films 30 between MG and SG1 and between SG1 and SG2 are removed by using the resist 40 as a mask. In this case, since the TEOS film 30 has film quality different from that of the HTO film 29, an etching selectivity to the HTO film 29 can be increased to some extent. For this reason, only the TEOS film 30 can be etched without removing the HTO film 29. As a result, the sidewall insulating films of the selection gate electrodes SG1 and SG2 of the selection gate transistor can be reduced in thickness by the film thickness of the TEOS film 30.

In the step of removing the TEOS film 30, a step may be formed on a boundary portion of the resist 40, i.e., the HTO film 29 formed on an upper surface of the gate electrode MG adjacent to selection gate electrode SG1.

Figure 6B:
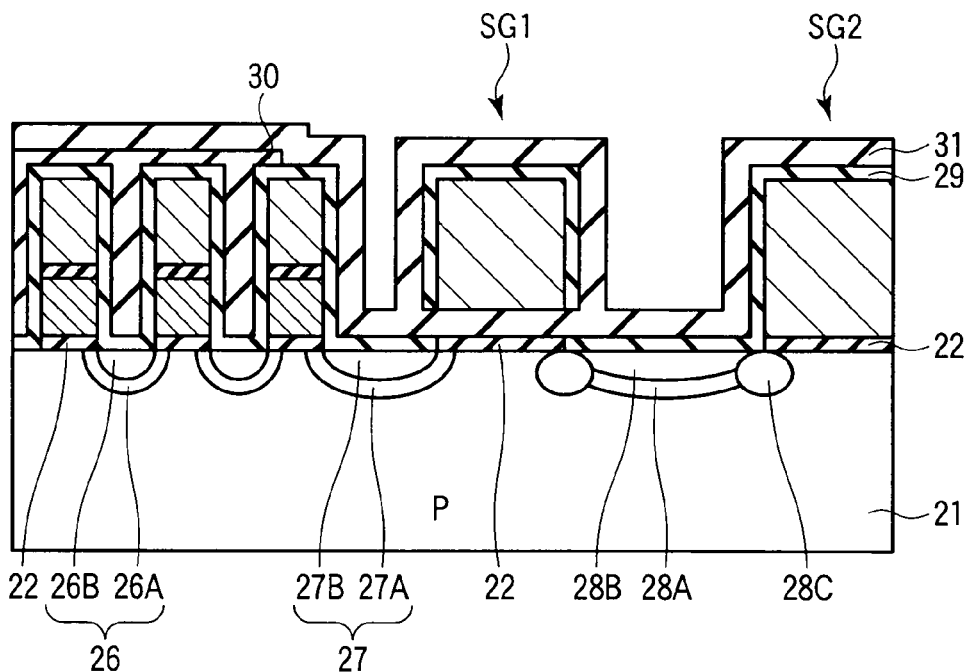

Thereafter, as shown in FIG. 6B, the resist 40 is removed, a third insulating film, for example, the TEOS film 31 is deposited by CVD to cover the plurality of first gate electrodes MG and the selection gate electrodes SG1 and SG2. More specifically, the TEOS film 31 is deposited on a major surface of the semiconductor substrate 21. In this case, the TEOS film 31 is formed to have such a film thickness that the TEOS film 31 does not completely bury a gap between the gate electrode MG and selection gate electrode SG1 and a gap between the selection gate electrodes SG1 and SG2. As shown in FIG. 2, the TEOS film 31 is formed on side surfaces of the selection gate electrodes SG1 and SG2 and a side surface of the gate electrode MG between MG and SG1 by anisotropic etching, for example, reactive ion etching (RIE).

As needed to reduce the bit line contact resistance, the diffusion layer 28D having an impurity concentration higher than that of the diffusion layer 28B is formed in a surface region of the diffusion layer 28B. Thereafter, an interlayer insulating film (not shown) is deposited on the major surface of the semiconductor substrate 21, and then, a bit line contact electrode 6 is formed on the fourth diffusion layer 28D between SG1 and SG2.

In this case, since the TEOS film 30 is removed, the insulating films formed on the side surfaces of the selection gate electrodes SG1 and SG2 reduce in thickness. For this reason, the bit line contact electrode 6 can be prevented from being in contact with the selection gate electrodes SG1 and SG2. When a contact resistance has no problem, the diffusion layer 28D need not be formed, and the bit line contact electrode 6 may be formed on the diffusion layer 28B.

With the above manufacturing steps, compensation for halo ion implantation which densely implants ions into the diffusion layers between the gate electrode MG of the memory cell and selection gate electrode SG1 of the selection gate transistor (between MG and SG1) and between the selection gate electrodes SG1 and SG2 of the selection gate transistor can be performed.

Sidewall insulating films of the selection gate electrodes SG1 and SG2 of the selection gate transistor can be reduced, and a chip area can be prevented from increasing.

Second Embodiment

A NAND flash memory according to a second embodiment of the present invention will be described below. The same reference numbers as in the configuration of the first embodiment denote the same parts in the configuration of the second embodiment, and a description thereof will be omitted. In the first embodiment, a structure of a memory cell array in a NAND flash memory is described in the first embodiment. However, in the second embodiment, in addition to the memory cell array, a structure of a peripheral transistor included in a peripheral circuit formed on a peripheral portion on the same semiconductor substrate as that of the memory cell array and a method of manufacturing the peripheral transistor is described.

Figure 7:
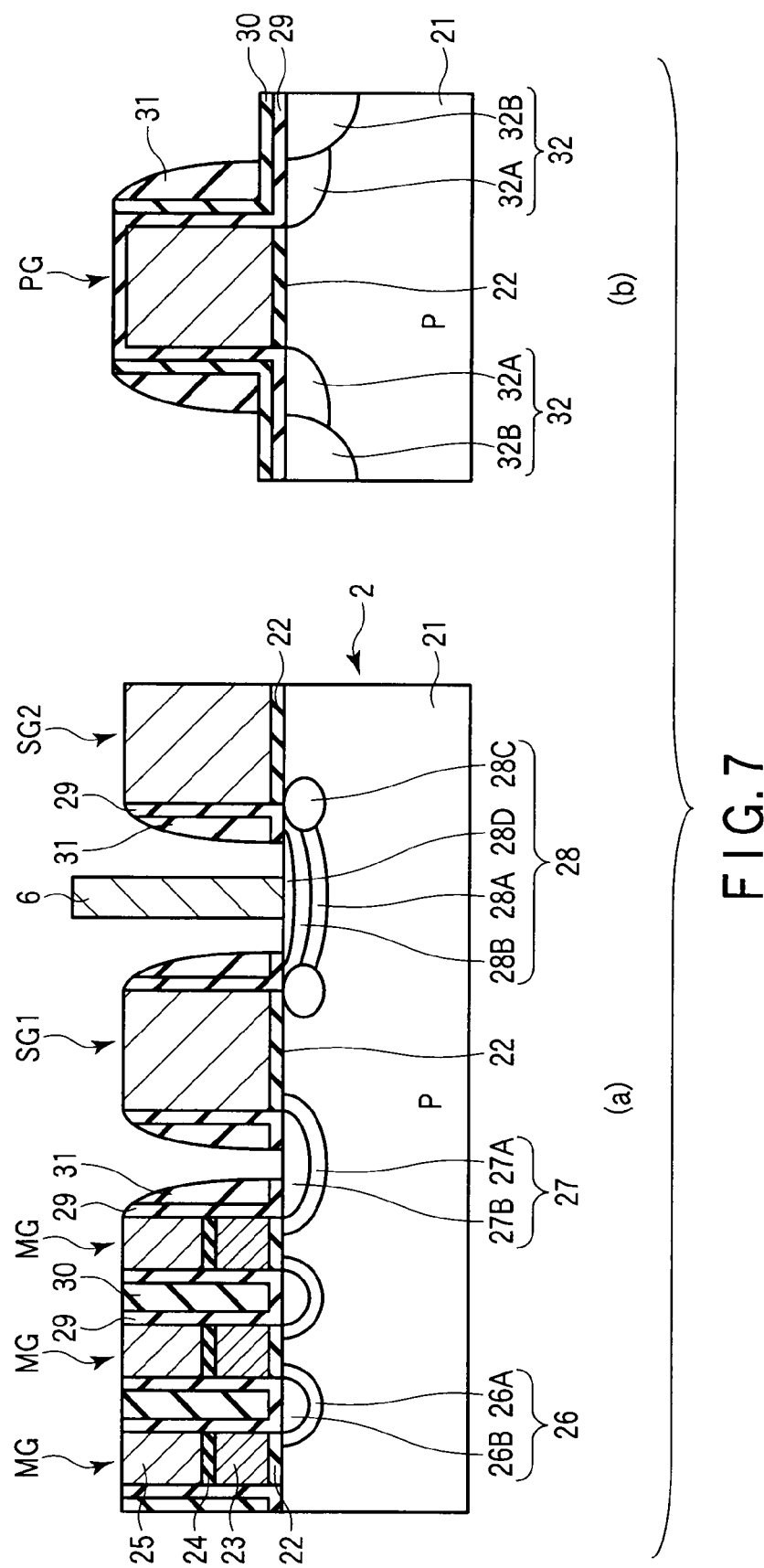
FIG. 7 is sectional view showing a structure of a NAND flash memory according to a second embodiment of the present invention.

FIG. 7 is sectional views showing a structure of a NAND flash memory according to the second embodiment, (a) shown in FIG. 7 shows a memory cell portion in which a memory cell array is formed, and (b) shown in FIG. 7 shows a peripheral portion in which a peripheral transistor is formed.

The memory cell portion shown in (a) of FIG. 7 has the same structure as that shown in FIG. 2. On the semiconductor substrate 21, the gate electrodes of memory cell transistors and selection gate electrodes SG1 and SG2 of a section gate transistor are formed. The bit line contact electrode 6 is formed between SG1 and SG2.

In the peripheral transistor of the peripheral portion, as shown in (b) of FIG. 7, the gate insulating film 22 is formed on the semiconductor substrate 21, and a gate electrode PG is formed on the gate insulating film 22. In semiconductor substrates on both sides of the gate electrode PG, source and drain diffusion layers 32 are formed, respectively.

On a side surface of the gate electrode PG, a first insulating film, for example, the HTO film 29 is formed. On the HTO film 29 on the side surface of the gate electrode PG, the second insulating film, for example, the TEOS film 30 is formed. Furthermore, on the TEOS film 30 on the side surface of the gate electrode PG, the TEOS film 31 is formed. A sidewall insulating film is formed by the HTO film 29, the TEOS film 30, and the TEOS film 31.

The sidewall insulating film formed on the side surface of the gate electrode PG of the peripheral transistor is formed to have a film thickness which is larger than film thicknesses of the sidewall insulting films of the selection gate electrodes SG1 and SG2 of the selection gate transistor and a film thickness of the sidewall insulating film of the memory cell between the gate electrode MG and selection gate electrode SG1 by the film thickness of the TEOS film 30. The diffusion layer is formed in the semiconductor substrate 21 to sandwich the gate electrode PG.

The diffusion layer 32 has a so-called LDD structure and is constituted by an n-type diffusion layer 32A and an $n^+$-type diffusion layer 32B having an impurity concentration higher than that of the n-type diffusion layer 32A. The n-type diffusion layer 32A extends from a portion near an end of the gate electrode PG in a direction away from the gate electrode PG. The $n^+$-type diffusion layer 32B extends from a portion near an end of the TEOS film 31 in a direction away from the gate electrode PG.

For this reason, the $n^+$-type diffusion layer 32B having the LDD structure can be far apart from the end of the gate electrode PG. More specifically, in comparison with a case in which an LDD structure is formed by using a sidewall insulating film (HTO film 29 and TEOS film 31) of the selection gate transistor, the $n^+$-type diffusion layer 32B having the LDD structure can be made farther away from the end of the gate electrode PG. As a result, an inter-source-drain withstand voltage of the peripheral transistor can be improved.

In particular, the drain diffusion layer 32 can be applied to a high-withstand-voltage transistor which controls a voltage of 20 V or more applied across a source and a drain. In this case, the film thickness of the gate insulating film 22 of the peripheral transistor is larger than film thicknesses of gate insulating films of a memory cell transistor and a selection gate transistor.

The structure of the drain diffusion layer 32 is not limited to the LDD structure. The drain diffusion layer 32 may employ a DDD structure. The n-type diffusion layer 32A and the $n^+$-type diffusion layer 32B can be replaced with $p^-$-type diffusion layer and a $p^+$-type diffusion layer, respectively. On the other hand, when the bit line contact electrode 6 is brought into contact with the sidewall insulating film of selection gate electrode SG1 by misalignment in lithography, the bit line contact electrode 6 decreases in diameter by a size corresponding to the contact, and a contact resistance disadvantageously increases. Furthermore, a chip area can be reduced by a size corresponding to a reduced film thickness of the sidewall insulating film.

According to the second embodiment having the structure described above, in addition to the effect held by the first embodiment, the sidewall insulating film of the selection gate transistor can be reduced, and the chip area can be reduced. At the same time, since the sidewall insulating film of the peripheral transistor is formed to have a film thickness larger than a film thickness of the sidewall insulating film of the selection gate transistor, the characteristics of the peripheral transistor can be improved.

A method of manufacturing a NAND flash memory according to the second embodiment will be described below.

Figure 9B:
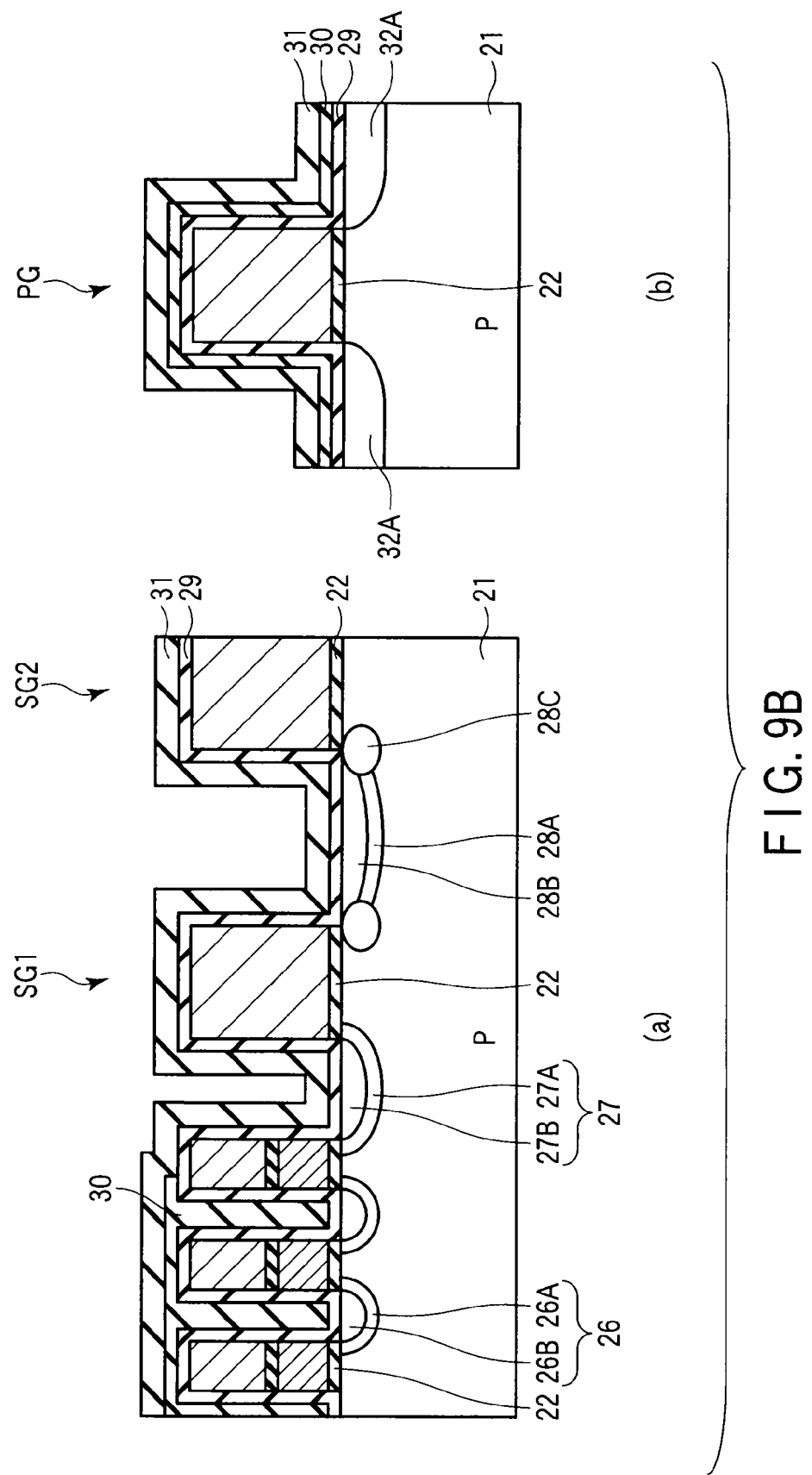

FIGS. 8, 9A and 9B are sectional views showing a method of manufacturing a NAND flash memory according to the second embodiment, (a) and (b) shown in FIG. 8 show the same step, (a) and (b) shown in FIG. 9A show the same step, and (a) and (b) shown in FIG. 9B show the same step.

The structure shown in (a) of FIG. 8 is the same structure as that shown in FIG. 5. A method of manufacturing the structure is the same as that in FIG. 5. In the steps of forming the gate electrode MG and the selection gate electrodes SG1 and SG2 shown in FIG. 3, also in the peripheral portion, the gate electrode PG is formed on the semiconductor substrate 21. Subsequently, in step of forming the diffusion layers 26B, 27B and 28B, also in the peripheral portion, the n-type diffusion layer 32A is formed in the semiconductor substrates 21 on both the sides of the gate electrode PG by using the gate electrode PG as a mask.

Thereafter, as shown in (a) of FIG. 8, in the step of forming the HTO film 29 and the TEOS film 30 on a major surface of the semiconductor substrate 21, also in the peripheral portion shown in (b) of FIG. 8, the HTO film 29 and the TEOS film 30 are formed on a major surface of the semiconductor substrate 21 to cover the gate electrode PG. Subsequently, in the step of forming the resist 40 in the memory cell portion, the upper surface of the TEOS film 30 is covered with the resist 40 in the peripheral portion. Furthermore, phosphorous ions and boron ions are implanted in the memory cell portion. However, since the peripheral portion is covered with the resist 40, the ion implantation is not performed.

In the memory cell portion shown in (a) of FIG. 9A, the TEOS films 30 between MG and SG1 and between SG1 and SG2 are removed by using the resist 40 as a mask. In this step, in the peripheral portion shown in (b) of FIG. 9A, since the TEOS film 30 is covered with the resist 40, the TEOS film 30 is not removed.

Thereafter, in the memory cell portion shown in (a) of FIG. 9B, the resist 40 is removed, and a third insulating film, for example, the TEOS film 31 is deposited by a CVD to cover the plurality of gate electrodes MG and the selection gate electrodes SG1 and SG2. In this step, also in the peripheral portion shown in (b) of FIG. 9B, the TEOS film 31 is deposited to cover the gate electrode PG. More specifically, the TEOS film 31 is deposited on a major surface of the semiconductor substrate 21. In this case, the TEOS film 31 is formed to have such a film thickness that the TEOS film 31 does not completely bury a gap between the gate electrode MG and selection gate electrode SG1 and a gap between the selection gate electrodes SG1 and SG2.

Subsequently, in the memory cell portion shown in (a) of FIG. 7, by anisotropic etching, for example, RIE, the TEOS films 31 are left on side surfaces of the selection gate electrodes SG1 and SG2 and a side surface of the gate electrode MG between MG and SG1. In this step, also in the peripheral portion shown in (b) of FIG. 7, the TEOS film 31 is left on a side surface of the gate electrode PG by anisotropic etching. The HTO film 29 and the TEOS film 30 which are not covered with the TEOS film 31 formed on the side surface of the gate electrode MG are removed by this step.

Thereafter, in the peripheral portion shown in (b) of FIG. 7, for example, arsenic ions are implanted by ion implantation by using the gate electrode PG and the TEOS film 31 as masks to form the n$^+$-type diffusion layer 32B. In the memory cell portion, as in the first embodiment, the diffusion layer 28D is formed. Thereafter an interlayer insulating film (not shown) is deposited, and then the bit line contact electrode 6 is formed on the diffusion layer 28D.

With the steps described above, in addition to the memory cell array according to the first embodiment, a peripheral transistor can be formed in the peripheral portion. In the second embodiment, the sidewall insulating film of the peripheral transistor can be formed to have a film thickness which is larger than that of the sidewall insulating film of the selection gate transistor by the film thickness of the TEOS film 30. For this reason, a high-withstand-voltage transistor which controls a voltage of, for example, about 20 V can be easily manufactured.

In the embodiment according to the present invention, the sidewall of the gate electrode is constituted by two layers, i.e., the HTO film having a low etching rate and the TEOS film having a high etching rate, and the TEOS film of the sidewall of the selection gate electrode is partially removed, the sidewall insulating film of the selection gate transistor can be reduced in thickness. At this time, a film thickness of a sidewall insulating film of a peripheral MOS transistor constituting the peripheral circuit does not decrease. When boron ions are obliquely implanted before one TEOS film of the sidewall of the selection gate electrode is removed, boron ions can be prevented from being implanted into a space between the selection gate transistor and the memory cell, the space being larger than a space between the memory cells. When phosphorous ions are implanted into a semiconductor substrate surface, compensation for halo ion implantation which densely implants ions into a large space between the selection gate transistor and the memory cell can be performed.

The embodiment of the present invention provides a semiconductor memory device which can prevent a threshold voltage of a memory cell arranged adjacent to a selection gate transistor from rising and can reduce a chip area and a method of manufacturing the same.

The embodiments described above cannot merely be independently executed, but also can be executed by being combined to each other. In each of the embodiments, the n-type memory cell transistor and the n-type selection gate transistor are exemplified. However, a p-type memory cell transistor and an n-type selection gate transistor may be performed. In this case, the n-type transistor and the p-type transistor described in the embodiments may be replaced with each other.

Furthermore, each of the embodiments described above includes inventions in various phases. The inventions in the various phases can also be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    first gate electrodes of a plurality of memory cell transistors formed on a semiconductor substrate in series with each other;
    a second gate electrode of a first selection gate transistor which is adjacent to one end of the plurality of first gate electrodes formed in series with each other and formed on the semiconductor substrate;
    a third gate electrode of a second selection gate transistor which is adjacent to the second gate electrode of the first selection gate transistor and formed on the semiconductor substrate;
    a fourth gate electrode of a peripheral transistor formed on the semiconductor substrate;
    a first sidewall insulating film formed on a side surface of the second gate electrode;

a second sidewall insulating film formed on a side surface of the third gate electrode;

a third sidewall insulating film formed on a side surface of the fourth gate electrode;

a first diffusion layer formed in the semiconductor substrate between the first gate electrodes; and a second diffusion layer formed in the semiconductor substrate between the first gate electrode and the second gate electrode, the second diffusion layer having impurity concentrations of an n-type impurity and a p-type impurity higher than those of the first diffusion layer, wherein a film thickness of the third sidewall insulating film is larger than film thicknesses of the first sidewall insulating film and the second sidewall insulating film, a space between the first gate electrode and the second gate electrode is larger than a space between the first gate electrodes, and a space between the second gate electrode and the third gate electrode is larger than the space between the first gate electrode and the second gate electrode.

2. The semiconductor memory device according to claim 1, wherein the third sidewall insulating film has a first insulating film, a second insulating film, and a third insulating film sequentially formed from a side surface side of the fourth gate electrode, the first and the second sidewall insulating films have the first insulating film and the third insulating film sequentially formed from the side surface side, and a gap between the first gate electrodes is buried with the first insulating film and the second insulating film.

3. The semiconductor memory device according to claim 2, wherein the first diffusion layer between the first gate electrodes has a first layer and a second layer formed on the first layer, the first layer functions as a punch-through stopper, the second layer functions as a source and a drain, the second diffusion layer between the first gate electrode and the second gate electrode has a third layer and a fourth layer formed on the third layer, the third layer functions as a punch-through stopper, and the fourth layer functions as a source and a drain.

4. The semiconductor memory device according to claim 3, wherein the semiconductor substrate under the first gate electrode and the second gate electrode is a semiconductor region of a first conductivity type, and the first and the third layers are semiconductor regions of the first conductivity type, and the second and the fourth layers are semiconductor regions of a second conductivity type.

5. The semiconductor memory device according to claim 4, wherein the third layer contains an impurity of the first conductivity type and an impurity of the second conductivity type.

6. The semiconductor memory device according to claim 2, further comprising: a third diffusion layer formed in the semiconductor substrate between the second gate electrode and the third gate electrode, third diffusion layer having a fifth layer, a sixth layer formed on the fifth layer, and seventh layers formed at both ends on the sixth layer, wherein the fifth layer functions as a punch-through stopper, the sixth layer functions as a source and a drain, the seventh layers are arranged under the second gate electrode and the third gate electrode, and the seventh layers function as a punch-through stopper.

7. The semiconductor memory device according to claim 6, wherein the fifth layer contains an impurity of the first conductivity type and an impurity of the second conductivity type.

* * * * *